United States Patent [19]

Rosenkranz

[11] Patent Number: 5,475,718
[45] Date of Patent: Dec. 12, 1995

[54] DIGITAL PHASE-LOCKED LOOP

[75] Inventor: Werner Rosenkranz, Erlangen, Germany

[73] Assignee: U.S. Philips Corporation, New York, N.Y.

[21] Appl. No.: 192,891

[22] Filed: Feb. 7, 1994

[30] Foreign Application Priority Data

Feb. 5, 1993 [DE] Germany ............... 43 03 356.3

[51] Int. Cl.$^6$ ..................... H03D 3/24
[52] U.S. Cl. .............. 375/376; 327/147; 327/150
[58] Field of Search ................. 375/118, 119, 375/120, 371, 373, 374, 376; 307/510, 359, 362, 236; 328/63, 109, 129.1, 130.1; 327/147, 150, 335

[56] References Cited

U.S. PATENT DOCUMENTS

| | | | |
|---|---|---|---|
| 4,888,564 | 12/1989 | Ishigaki | 375/120 |
| 5,036,294 | 7/1991 | McCaslin | 375/120 |
| 5,276,715 | 1/1994 | Guiseppina et al. | 375/120 |

*Primary Examiner*—Stephen Chin
*Assistant Examiner*—Tesfaldet Bocure
*Attorney, Agent, or Firm*—Steven R. Biren

[57] ABSTRACT

A digital phase-locked loop includes a digital controller whose output is coupled to a controllable oscillator and which loop comprises a phase detector (PD) whose two inputs are provided to receive a pulse-shaped reference signal (REF) and a pulse-shaped oscillator signal (OSC) generated by the oscillator. This phase detector comprises a first circuit branch provided to receive the reference and the oscillator signal, to form a pulse-shaped signal whose pulse width is equal to the distance in time between two specific successive pulse edges of the reference and oscillator signal, to filter by low-pass filter the pulse-shaped signal and to code sample values of the low-pass filtered signal with a first number (Nf) of least significant bits. This phase detector comprises a second circuit branch, coupled to the first circuit branch, which second branch comprises a counter means which changes its count if no or more than one specific edge of the oscillator signal occur(s) between two successive given edges of the reference signal, which codes the result of the counting with a second number (Ng) of most significant bits.

7 Claims, 5 Drawing Sheets

$K_{d1} = 12, iv1 = 1$
$K_{d2} = 1, iv2 = 12$ $K_{d1} = 12$, iv1 = 1
$K_{d2} = 1$, iv2 = 2 × 12

DIGITAL PHASE-LOCKED LOOP

BACKGROUND OF THE INVENTION

The invention relates to a digital phase-locked loop.

In communication technology there is often the problem of synchronizing the frequency and phase of an oscillator with a reference signal. To solve the problem, so-called phase-locked loops are used. One distinguishes analog phase-locked loops working with analog signals, and digital phase-locked loops working with discrete-time and/or discrete-value signals within the control loop.

U.S. Pat. No. 4,107,623 has disclosed a phase-locked loop for synchronizing the frequency and phase of an oscillator with that of a reference oscillator. The arrangement comprises an analog control loop for fine adjustment and a digital control loop for coarse adjustment of the frequency of the oscillator signal. The use of the digital phase-locked loop makes it also possible to work with large phase differences between the two oscillators that are to be synchronized.

SUMMARY OF THE INVENTION

It is an object of the invention to develop a digital phase-locked loop comprising a high resolution and a large dynamic range.

The object is achieved in that a digital phase-locked loop is provided comprising a controller whose output is coupled to a controllable oscillator, comprising a phase detector whose two inputs are arranged for receiving a reference signal and an oscillator signal that is generated by the oscillator, which phase detector comprises a first circuit branch for deriving a first value from the time difference between reference points of the two input signals of the phase detector, comprises a second circuit branch which includes a counter device which counter device forms a difference between a number of reference points of the reference signal and a number of reference points of the oscillator signal which have been detected from a reference instant onwards, to form a second value while combining means are provided for combining the first and second values.

In digital communication systems it is necessary to synchronize the clock of a received signal with that of the transmitted signal. Normally, the clock of the transmitted signal is derived from the data signal. The derived clock representing the output signal of an oscillator in the receiving system is to correspond as regards frequency and phase to the clock of the transmitted signal which is to be considered the reference signal. For synchronizing the pulse-shaped oscillator signal with the pulse-shaped reference signal, a digital phase-locked loop is used. The digital phase-locked loop comprises a digital controller which can be easily realised with a signal processor. A suitable controller for the present use is, for example, a PI controller. This controller comprises a proportional element and an integral element. Furthermore, a controllable oscillator is included. The frequency of this oscillator is adjusted by means of the digital output signals of the controller. A first input of a phase detector, whose second input is arranged for receiving a pulse-shaped reference signal, is coupled to the output of the oscillator. The output signal of the phase detector determines the phase difference between reference and oscillator signal. The output of the phase detector is coupled to the input of the digital controller.

To reach as smooth a variation of the phase or frequency of the oscillator signal as possible in the stationary period of the digital phase-locked loop, it is advantageous to arrange the phase-locked loop or digital controller in such a way that the bandwidth of the digital phase-locked loop is small. A small bandwidth of the phase-locked loop, however, results in that large deviations of the phase difference occur if there are sudden changes in the phase difference between reference and oscillator signal, which changes especially occur in the initial period of the phase-locked loop. For this reason, the phase detector is to have a large dynamic range.

In a first branch of the phase detector there is formed from the pulse-shaped reference and oscillator signals a pulse-shaped signal whose pulses have a width corresponding to the distance in time between two given successive edges of oscillator and reference signal. A given pulse edge may be an ascending or descending pulse edge. A measure for the phase difference between reference and oscillator signal is the duty cycle of the pulse-shaped signal recovered from these two signals. The instantaneous duty cycle is formed in that the pulse width is divided by the sum of the width of a pulse and that of an adjacent pulse pause. When the phase difference is expressed in terms of units of rad, a duty cycle of 0 corresponds to the phase difference 0 and a duty cycle of 1 to the phase difference $2\pi$, if the given edges of reference and oscillator signal are ascending edges in both cases. With the duty cycle it is only possible to describe a phase difference in the area between 0 and $2\pi$. If the phase difference exceeds for example the value of $2\pi$, the duty cycle leaps from the value of 1 to the value of 0. Generally speaking, the duty cycle is to leap from the value of 1 to the value of 0 if the phase difference exceeds positive or negative integer multiples of $2\pi$. If the given edges of reference and oscillator signal are an ascending edge in one signal and a descending edge in another, a duty cycle of 0 corresponds to the phase difference $\pi$ and a duty cycle of 0.5 corresponds to the phase difference 0 or $2\pi$. This may be used for shifting the operating point of the phase-locked loop. The pulse-shaped signal formed from the reference and oscillator signal is applied to a low-pass filter. The limit frequency of this filter is selected to be so low as to have frequency portions strongly attenuated by the clock frequency of reference and oscillator signal. The frequency range covering changes of the phase difference of reference and oscillator signal comprises frequencies which are smaller by orders of magnitude than the clock frequency of reference and oscillator signal. The limit frequency of the low-pass filter, however, is still so large that sudden changes of the duty cycle of the low-pass filter input signal, which changes occur when the phase difference exceeds or falls short of positive or negative integer multiples of $2\pi$— to be designated $2\pi$-range transgressions—are represented by steep edges at the output of the low-pass filter. The low-pass filter signal is then sampled, quantized and coded with a first number of least significant bits.

The phase detector further includes a second circuit branch. The input of the second circuit branch is coupled to the input or output of the first branch or, alternatively, to a point in the first branch. The pulse width or pulse pauses respectively, of the pulse-shaped signal that is fed to the low-pass filter of the first circuit branch, are determined by two given edges of reference and oscillator signal. For example, a given edge of the reference signal introduces a pulse, a successively given edge of the oscillator signal terminates this pulse. If one edge of the oscillator signal lies between two given edges of the reference signal, the phase difference does not transgress the $2\pi$-range. If, however, no or more than one edge of the oscillator signal lies/lie between two successive given edges of the reference signal, the phase difference transgresses the 2π-range. In these cases the count of the counter means inserted into the second circuit branch is incremented or decremented by unity. The counter means codes its count with a second number of most significant bits.

In the first circuit branch of the phase detector the phase difference between reference signal and oscillator signal is quantized with a fine-stage step-like characteristic. The characteristic shows leaps 2π times the phase difference apart, which provide a sawtooth pattern in the characteristic. In the second circuit branch the phase difference is quantized with a coarse-stage step-like characteristic. The beginning of a step is always at the position of a leap in the first characteristic. The characteristic of the phase detector is obtained by superimposing the characteristic of the first and second circuit branches of the phase detector. The fine quantization in the first circuit branch provides that a high resolution of the phase detector is obtained, the coarse quantization of the phase difference carried out in the second circuit branch provides that a large dynamic range of the phase detector is obtained. The superpositioning of the quantization characteristics of the first and second circuit branches of the phase detector corresponds to the least significant bits produced by the first circuit branch being combined with the most significant bits produced by the second circuit branch to form bit-words. The high resolution of the phase detector produces non-linear effects such as, for example, limit frequency cycles. The large dynamic range of the phase detector provides a large lock-on and hold range of the digital phase-locked loop.

A further embodiment of the invention is characterized in that the first circuit branch is provided for:

receiving the pulse-shaped reference and pulse-shaped oscillator signal, forming a pulse-shaped signal whose pulse widths are each time derived from the distance in time between two given successive pulse edges of reference and oscillator signal used as reference points, low-pass filtering the pulse-shaped signal, and coding sample values of the low-pass filtered signal with a first number of least significant bits, and in that the second circuit branch is provided for coding the second value with a second number of most significant bits.

To derive in the first circuit branch a pulse-shaped signal describing the phase difference between reference and oscillator signal from the reference and oscillator signal, it is necessary to include a converter means. Such a converter means may be advantageously arranged as a trigger circuit whose output state is changed when ascending or descending edges of reference or oscillator signal are present at the inputs. The converter means can be realised simply and cost-effectively in this manner.

The invention is further advantageously embodied in that the counter means in the second circuit branch is arranged as an up/down-counter at whose inputs the reference and the oscillator signal are present.

It is the function of the second circuit branch to count how many times and in what direction the phase difference has exceeded or fallen short of respectively, positive or negative integer multiples of 2π. Such a counter means may be formed, for example, by an up/down-counter. The reference and the oscillator signal are applied to two inputs of this counter. The count is incremented, for example, when a given edge of the reference signal is present at the count input. The count is decremented by unity when a given edge of the oscillator signal is present at the other input of the counter. The given edges of reference and oscillator signal may be either ascending or descending edges of reference and oscillator signal as explained hereinbefore. This produces a constant fluctuation of the count. The lower of the two successive counts denotes in multiples of 2π the phase difference contributions to be counted.

Another possibility of expanding the scope of the invention consists of the fact that the input of the second circuit branch of the phase detector is arranged for receiving the low-pass filtered pulse-shaped signal of the first circuit branch, that a differentiator i.e. high-pass filter is arranged at the input of the second circuit branch, that a threshold detector is coupled to the output of the differentiator i.e. high-pass filter and that an up/down-counter is coupled to the output of the threshold detector.

With high frequencies of oscillator and reference signal it is meaningful not to apply these signals directly to a counter. In this circuit arrangement the signal present at the output of the low-pass filter of the first circuit branch of the phase detector and describing a phase difference between 0 and 2π is applied to a differentiator i.e. high-pass filter. The high-pass filter is to have a limit frequency that is smaller than the limit frequency of the low-pass filter of the first circuit branch. The steep edges of the signal describing the phase difference and present at the output of the low-pass filter of the first branch are filtered out by the differentiator i.e. high-pass filter. The steep edges can be found at the positions where there is a 2π-range transgression. Steep edges of the input signal present at the input of the differentiator i.e. high-pass filter, are convened to spike-shaped pulses at the output. The remaining signal portions of the input signal are strongly attenuated. The signal generated in this manner is applied to a threshold detector. Always when a positive spike pulse is present i.e. when a positive threshold is transgressed, the threshold detector produces a first counting pulse on an up/down-counter. When a negative spike pulse is present at the input of the threshold detector i.e. when a negative threshold of the threshold detector is fallen short of, a second counting pulse is produced on the up/down-counter. When a first counting pulse is present at the up/down-counter, the count is decremented by unity, when a second counting pulse is present, the count is incremented by unity. Advantageously, a phase-locked loop comprising such a phase detector is used if the reference and the oscillator signal have a high rate of occurrence. Counting pulses only occur at the input of the counter of the counter means in the event of 2π-range transgressions of the phase difference. The rate of the counting pulses present at the input of the counter lies by orders of magnitude below the clock rate of reference and oscillator signal. The count of the counter is coded with a second number of most significant bits.

Finally, a further embodiment of the invention consists in that the second circuit branch of the phase detector is coupled to the output of the first circuit branch, in that the second circuit branch is located in the digital section of the digital phase-locked loop, in that the second circuit branch comprises means for producing the difference between two successive phase difference sample values coded with a first number of bits, in that this difference is applied to a threshold detector and in that an accumulator means is provided for integrating the output values of the threshold detector.

In the digital section of the digital phase-locked loop, in which section also the digital controller is arranged, there is often unused computational capacity available. In that case it is suitable to position the second circuit branch of the phase detector in the digital section of the phase-locked loop. The second circuit branch is in that case supplied with the least significant bits present at the output of the first circuit branch. The result is a better use of the computational capacity of the digital section of the phase-locked loop. The second circuit branch is realised by a computer program. No additional modules are necessary for realising the second circuit branch.

If the sampling rate at which the phase difference is sampled, and which corresponds to the clock rate in the digital section of the phase-locked loop, is large compared with the frequency portion of the phase difference between reference and oscillator signal, the sample values of the phase difference in the first circuit branch are so close together that the phase differences corresponding to two adjacent sample values of the phase difference are small compared with the value of $2\pi$. The difference between two successive sample values of the phase difference in the first circuit branch is applied to a threshold detector which produces a positive or a negative count when a suitable threshold is transgressed or fallen short of respectively. In the other cases the value of 0 is present at the output of the threshold detector. Sudden changes of the signal variation in the first branch, as they occur when there are $2\pi$-range transgressions of the phase difference, can be detected in this manner. The output values of the threshold detector are added together by an accumulator. The accumulator then adopts the function of a counter. The output value of the accumulator is coded with the second number of most significant bits.

A further possibility of expanding the scope of the invention is in that the digital section of the phase-locked loop comprises a processing of the phase difference in accordance with a non-linear characteristic.

To obtain a most accurate synchronization of the reference and oscillator signal, it is advantageous to arrange the phase-locked loop as a narrow-band phase-locked loop. As already observed hereinbefore, large values of the phase difference between reference and oscillator signal occur in narrow-band phase-locked loops especially in the initial period of the synchronization. The stationary period of the phase-locked loop i.e. the operating point, is reached only slowly. The loop gain, which represents the product of all the gain factors of the phase-locked loop, is linked with the bandwidth of the phase-locked loop. Increasing the loop gain increases the bandwidth of the phase-locked loop. If in the initial period of the phase-locked loop, thus if there are large phase differences between reference and oscillator signal, the loop gain is adaptively increased in response to the phase difference, the initial period of the phase-locked loop can be shortened considerably. The stationary period, operating point, of the phase-locked loop is advantageously reached faster than with a phase-locked loop without the loop gain being adapted. This adaptation of the loop gain of the phase-locked loop can be realised in an additional circuit block inserted between phase detector and digital controller. A further advantage is that the dynamic range of the digital signals in the control loop is smaller. The word length of the digital controller may thus be shortened. This circuit block may also be arranged at the output of the digital controller. The block processes an input signal in accordance with a non-linear characteristic which rises as the phase difference increases. The slope of this characteristic corresponds to a gain factor. The non-linear characteristic may be realised with a computer program. Advantageously, still unused computational capacity in the digital section of the phase-locked loop is used and, therefore, no additional circuit arrangements are necessary.

A further embodiment of the invention is characterized in that the most significant bits generated in the second circuit branch are multiplied by a weight factor.

The favorable effects of the non-linear characteristic described above and realised in the digital section may also be achieved in this manner. The step heights of the characteristic of the second circuit branch of the phase detector are increased in this manner. This also increases the mean slope of the overall characteristic of the phase detector which is the result of the superpositioning of the characteristics of the first and second circuit branches. Phase differences exceeding or being equal to $2\pi$ are further processed by the phase-locked loop while a gain factor is used. The weight factor can be easily realised by shifting bits. Only very little computational capacity is necessary for such an operation.

BRIEF DESCRIPTION OF THE DRAWINGS

Embodiments of the invention will be further explained hereinbelow with reference to the drawing Figures, in which.

DETAILED DESCRIPTION OF THE PREFERRED EMBODIMENTS

Figure 1:
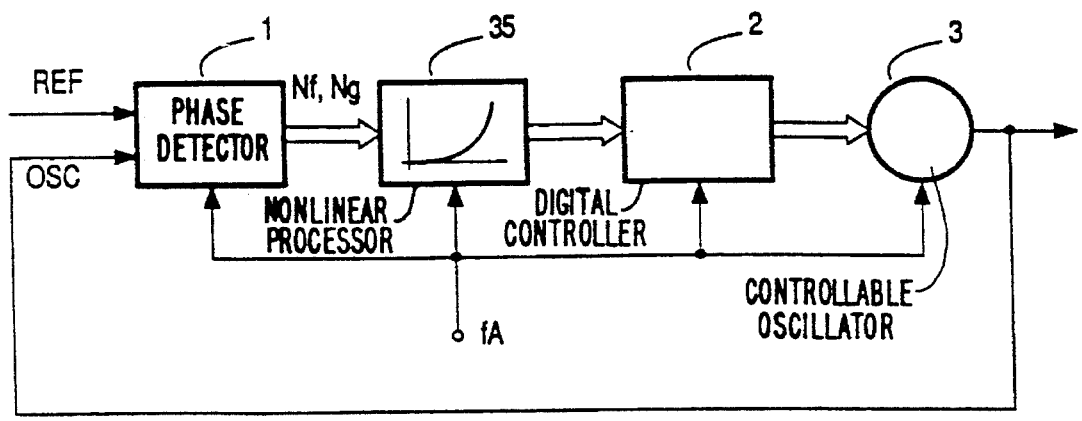
FIG. 1 shows a digital phase-locked loop.

The digital phase-locked loop represented in FIG. 1 comprises a phase detector 1 whose two inputs are supplied with a reference signal REF and an oscillator signal OSC. The phase detector 1 codes differences between the reference signal and the oscillator signal with a first number Nf of least significant bits and a second number Ng of most significant bits. The output of the phase detector 1 is coupled to the input of an optional circuit block 35 which processes an input signal in accordance with a non-linear characteristic. The slope of this characteristic, which corresponds to a gain factor, has the value of 1 with small input values and increases with an increasing input value. In this manner the loop gain of the phase-locked loop, which gain is formed by the product of all the gain factors of the phase-locked loop is increased in the event of large phase differences. The bandwidth of the phase-locked loop increases if the loop gain increases, the transient is accelerated and the operating point is reached at an early instant. The dynamic range and thus the necessary word length in the digital section of the phase-locked loop are reduced. A digital controller 2 is coupled to the output of this circuit block 35. The digital controller 2 is, for example, a PI controller. The output of the controller 2 is coupled to the input of a controllable oscillator 3. The controllable oscillator 3 is controlled by the digital output signals of the digital controller 2. The output of the oscillator 3, at which the pulse-shaped signal is present, is connected to an input of the phase detector.

The phase detector 1, the circuit block 35, the digital controller 2 and the controllable oscillator 3 are supplied with a clock signal having frequency fA. The frequency fA represents the sampling rate of the phase difference between the reference and oscillator signals. The pulse-shaped output signal of the controllable oscillator 3 is tapped and used, for example, for supplying the clock signals to the receiving section of a communication system.

Figure 2:
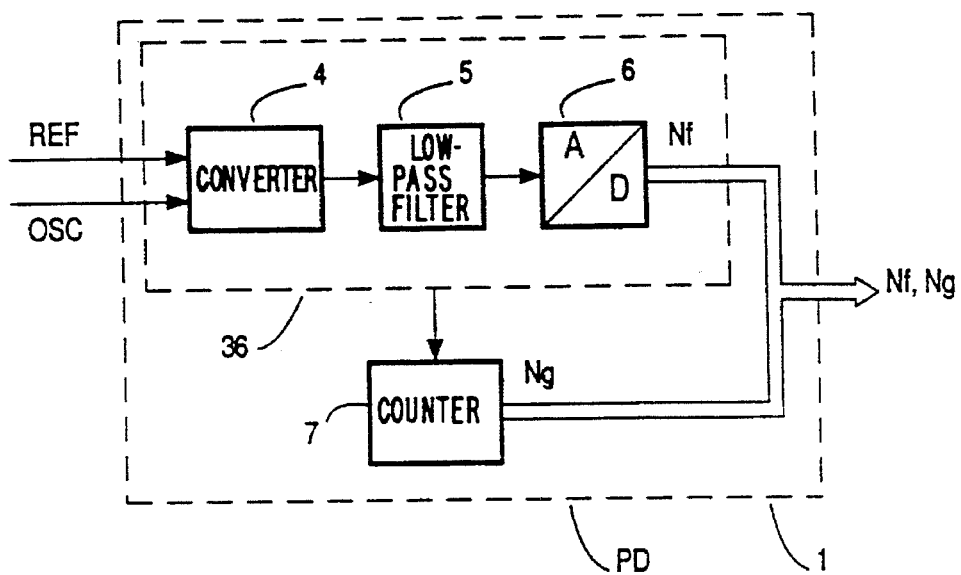
FIG. 2 shows a phase detector comprising two circuit branches.

FIG. 2 shows the structure of the phase detector 1 of the digital phase-locked loop. The phase detector comprises two circuit branches. The two inputs of the first circuit branch 36 of the phase detector, likewise forming the two inputs of the phase detector, are supplied with a pulse-shaped reference signal REF and a pulse-shaped oscillator signal OSC and these signals are applied to a converter device 4 arranged at the input of the first circuit branch. This converter device converts the time delay of reference and oscillator signal into a pulse-shaped signal whose pulse lengths and pulse pauses i.e. whose duty cycle is determined by the time delay of the phase difference, which corresponds to a pulse width modulation. The output of the phase detector 4 is coupled to the input of a low-pass filter 5. The low-pass filter 5 converts the pulse width modulated output signal of the converter device 4 into an amplitude modulated analog signal. The output signal of the low-pass filter 5 is applied to an analog/digital converter 6 which performs a sampling, quantization and coding with Nf bits.

A second circuit branch is coupled to the input, the output or a point in the first circuit branch. This second circuit branch comprises a counter device 7 incrementing or decrementing respectively, its count by unity if the phase difference between reference and oscillator signal exceeds or falls short of respectively, a positive or negative integer multiple of $2\pi$ (to be referenced $2\pi$-range transgression of the phase difference hereinafter). The count is coded with Ng most significant bits.

The least significant Nf bits produced by the first circuit branch and the most significant Ng bits produced by the second circuit branch are combined. They form a numerical value to describe the phase difference between reference and oscillator signal in an arbitrary measuring range that can be enlarged.

Figure 3:
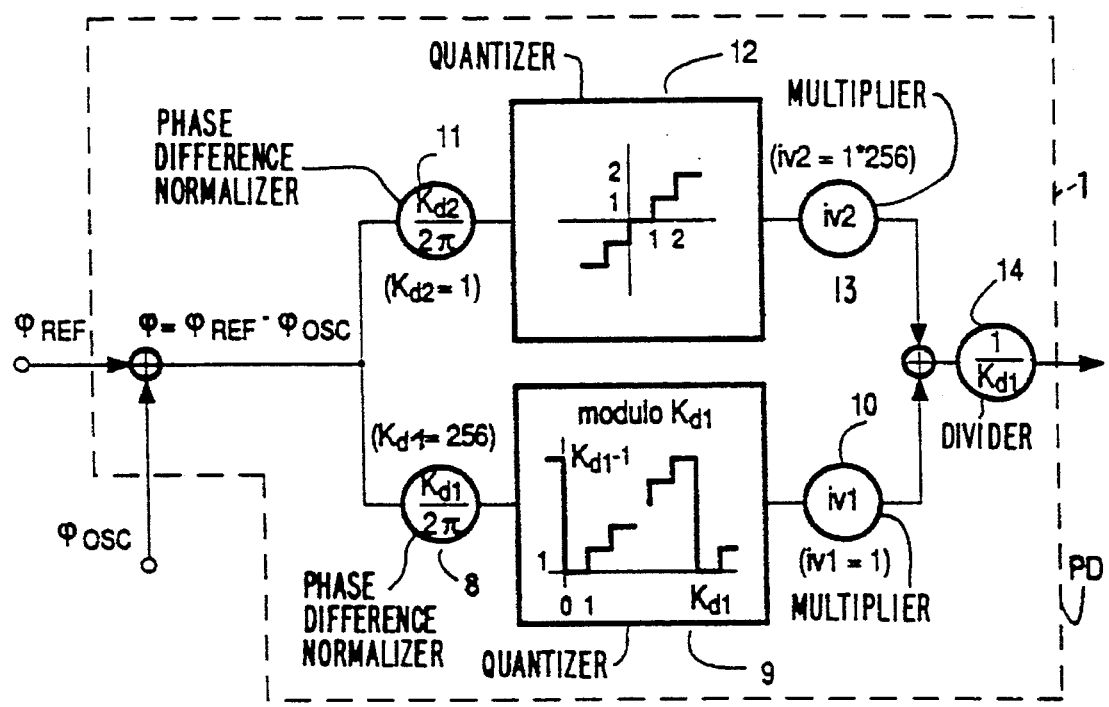
FIG. 3 shows a simulation model of the phase detector.

FIG. 3 represents a simulation model of the phase detector of the digital phase-locked loop. A computer program programmed according to this simulation model is used for determining the properties of the phase detector. At the input of the model the phase difference so is formed between reference and oscillator signal. This digitally available numerical value for the phase difference expressed in units rad is applied to a first function branch which simulates the first circuit branch of the phase detector. A function block 8 normalizes the phase difference to the value of $2\pi$ and performs a multiplication by the factor of Kd1. Subsequently, a quantization with a sawtooth-shaped characteristic is performed by a function block 9. A Kd1-modulo quantization is carried out. The quantization characteristic comprises Kd1 levels of height 1. A definition range of arbitrary size is assigned a limited value range having values between 0 and Kd1-1. The numerical values produced by the function block 10 are multiplied by a factor of iv1.

The numerical value representing the phase difference $\delta$ is furthermore applied to a second function branch which simulates the second circuit branch of the phase detector. A function block 11 performs a normalization to the value of $2\pi$ and a multiplication by the factor of Kd2. A function block 12 quantizes the numerical value obtained in this manner with a step-like characteristic having levels of height 1. This characteristic has a definition and value range which are limited only by the available numerical range. The numerical values obtained in this manner are multiplied by a factor of iv2 in a function block 13.

The output values of the first and second function branches are added together and divided by the value of Kd1 in a function block 14.

In the first function branch a fine quantization is performed. The Kd1 step heights of the quantization characteristic of the function block 9 can be quantized with Nf least significant bits. In the present example there are 256 step heights i.e. a coding with Nf=8 bits. The first function branch produces numerical values from 0 to 255 which correspond to phase differences between 0 and $2\pi$.

The second function branch performs a coarse quantization and a coding with Ng bits of the numerical values which represent the phase difference. The dynamic range of the coarse quantization characteristic depends only on the number Ng of most significant bits which are available for the coding of the step heights. In the present example the factor of iv2 is selected to be 256. Consequently, the step height of the characteristic of the second function branch has the value of 256.

The characteristic of the overall quantization resulting from the superpositioning of fine and coarse quantization characteristics of the phase detector combines the advantages of high resolution of the fine quantization characteristic with those of the large dynamic range of the coarse quantization characteristic. The height of the leaps in the sawtooth characteristic of the first function branch is equal to the step height of the characteristic of the second function branch. The overall quantization characteristic thus has a "smooth" pattern.

The division of the sum of the output values of the first and second function branches by the binary value of Kd1 provides a normalization. For example, a numerical value difference of 1 now corresponds to a phase difference of $2\pi$.

Figure 4:
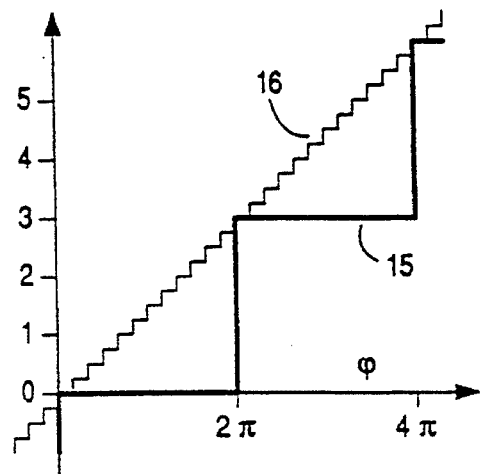
FIGS. 4 and 5 show two possible characteristics of the phase detector.
Figure 5:
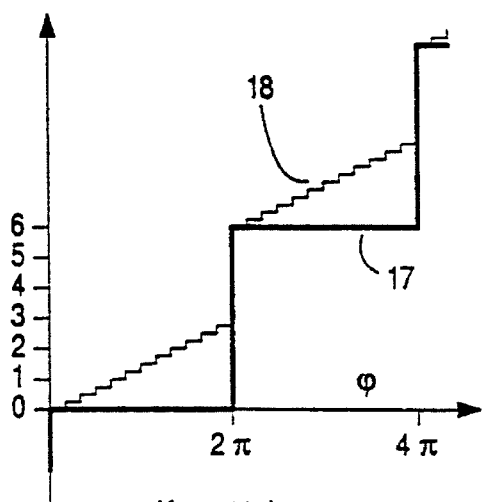

FIGS. 4 and 5 elucidate how the quantization characteristics of the first and second circuit branches can be added together to a single quantization characteristic. FIG. 4 represents the quantization characteristic of the second circuit branch. The function values of the characteristic 15 and the function values of a sawtooth quantization characteristic (not shown) of the first circuit branch are added together. There is the quantization characteristic 16 which combines the large dynamic range of the quantization characteristic of the second circuit branch with the high resolution of the quantization characteristic of the first circuit branch. In FIG. 5 the step height of the quantization characteristic of the second circuit branch is doubled. The quantization characteristic of the first circuit branch is unchanged. For phase differences exceeding $2\pi$ there is an additional gain factor which increases the loop gain. Phase differences exceeding $2\pi$ especially occur in the initial period of the phase-locked loop. Increasing the loop gain, which gain represents the product of all the gain factors of the phase-locked loop, widens the bandwidth of the phase-locked loop and shortens the transient. The stationary state of the phase-locked loop is reached faster.

Figure 6:
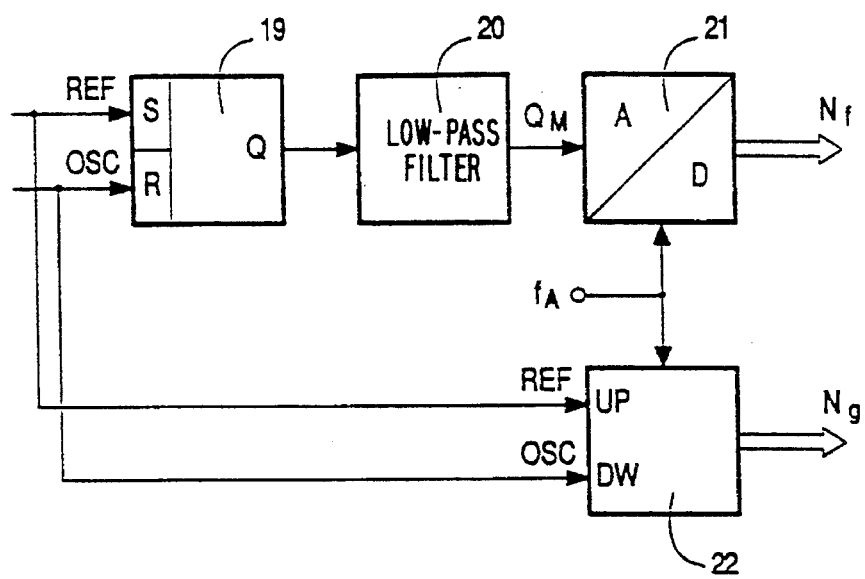
FIGS. 6, 9 and 11 show three embodiments of the phase detector of the phase-locked loop.

FIG. 6 represents a phase detector which comprises a first embodiment for the second circuit branch in addition to the first circuit branch which is the same in all the embodiments.

At the input of the first circuit branch of the phase detector there is arranged an edge triggered flip-flop 19 whose two inputs are supplied with the reference and oscillator signals. The flip-flop 19 is set when the reference signal has a positive edge and reset when the oscillator signal has a negative edge. The phase difference between reference and oscillator signal is converted to a pulse width modulated pulse-shaped signal Q. The duty cycle of the pulse-shaped signal Q describes the phase difference in the range from 0 to $2\pi$. A phase difference of 0 corresponds to a duty cycle of 0 and the phase difference of $2\pi$ corresponds to a duty cycle of 1. Phase differences exceeding $2\pi$ or falling short of 0 are converted to the range between 0 and $2\pi$ which corresponds to an addition or subtraction of integer multiples of $2\pi$. The signal Q is applied to a low-pass filter 20 which converts the pulse width modulated signal Q to an amplitude modulated signal QM. This signal is applied to an analog/digital converter 21 which samples the signal, performs a quantization and finally performs a coding with Nf bits. The sampling rate is equal to fA.

The second circuit branch of the phase detector comprises an up/down-counter 22. This up/down-counter 22 is supplied with the reference and oscillator signals. The count is incremented by unity if a positive edge of the reference signal is available at the first input of the counter 22. The count is decremented by unity if a positive edge of the oscillator signal is available at the second input of the counter 22. The lower of two successive counts is coded with Ng bits. At the beginning of the initial period of the phase-locked loop the count is set at the value of 0. The coded count of the counter 22 is read out, the counter 22 being clocked with the frequency fA. The output bits of the counter 22 are fed to the digital controller of the phase-locked loop together with the output bits of the analog/digital converter 21.

Figure 7:
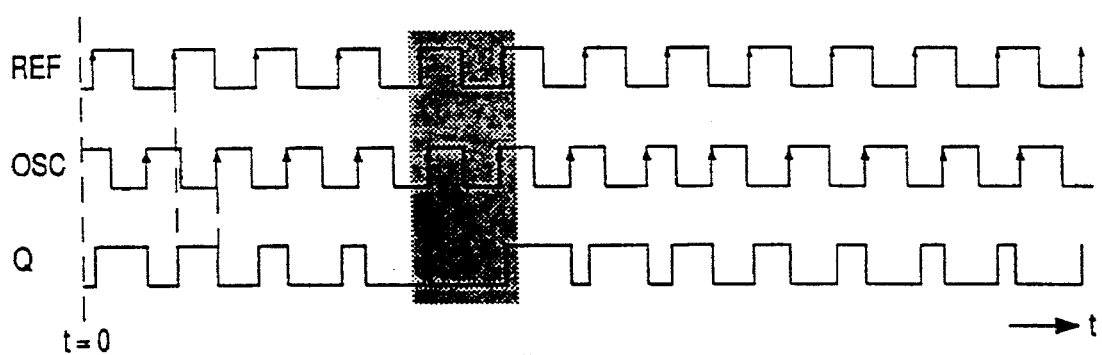
FIGS. 7 and 8 show time diagrams of a reference and oscillator signal as well as the pulse width modulated signal describing the phase difference.
Figure 8:
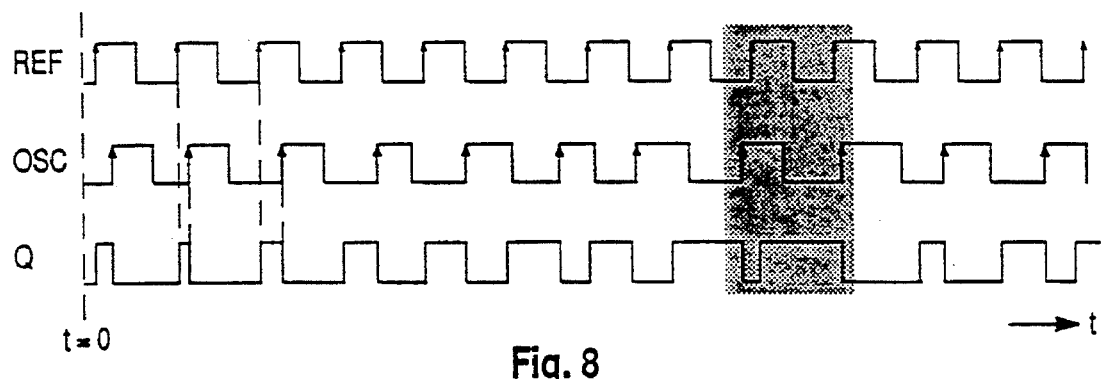

FIGS. 7 and 8 represent for two examples the time diagrams of reference signal, oscillator signal and output signal of the flip-flop 19. A reference instant t=0 at which the count of the counter 22 is 0 was determined arbitrarily. In the shaded part of FIG. 7 the phase difference falls short of the value of 0. It will be recognized that in this area two positive edges of the oscillator signal lie between two positive edges of the reference signal. The count is decremented by unity i.e. the count is set at −1. In the shaded part of FIG. 8 the phase difference exceeds the value of $2\pi$. In this part no positive edge of the oscillator signal lies between two positive edges of the reference signal. The count is incremented from 0 to 1.

Figure 9:
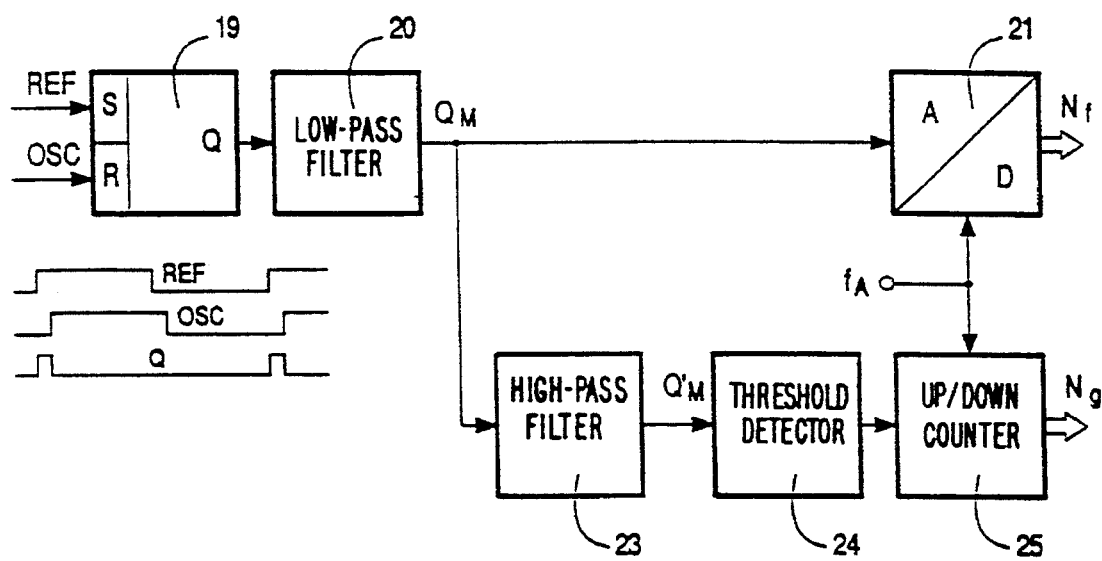

FIG. 9 represents a second embodiment of the phase detector. The first circuit branch of the phase detector is identical with a first circuit branch represented in FIG. 6. The second embodiment of the second circuit branch is coupled to the output of the low-pass filter 20. The output signal QM of the low-pass filter 20 is applied to a high-pass filter 23 which functions approximately as a differentiator. The output of the high-pass filter is coupled to a threshold detector which detects the transgression of the first threshold and the falling short of a second threshold. The output signal of the threshold detector 24 is applied to an up/down-counter 25. The count of the up/down-counter is coded with Ng bits.

Figure 10:
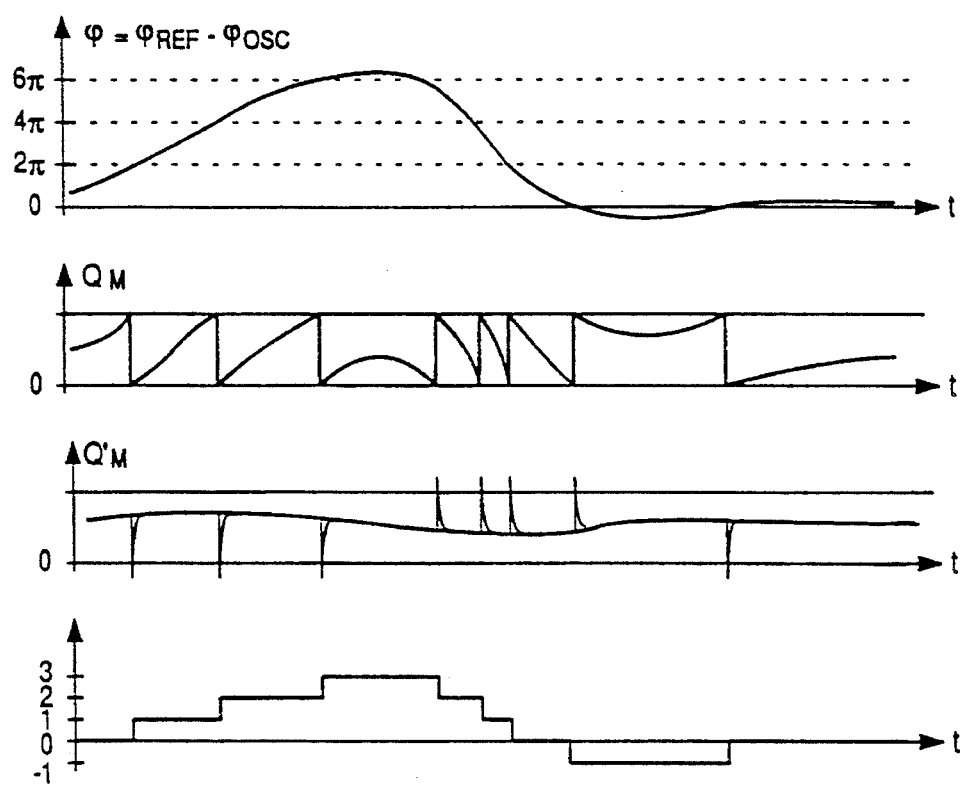
FIG. 10 shows by way of example, time diagrams of phase differences, low-pass filter output signal, high-pass filter output signal and count of the counter in the second circuit branch.

The operation of the second circuit branch of the phase detector shown in FIG. 9 will become apparent with reference to FIG. 10. The first diagram of FIG. 10 shows a pattern of the phase difference between reference and oscillator signal by way of example. The second diagram shows the associated variation with time of the output signal of the low-pass filter 20. If the phase difference exceeds or falls short of respectively, integer multiples of $2\pi$, there will be a steep descending or ascending edge of the output signal of low-pass filter 20 at these positions. The third diagram shows the signal pattern of the output signal of the high-pass filter 23 whose limit frequency is smaller than the limit frequency of the low-pass filter 20 approximately by a factor of 10. The limit frequency of the high-pass filter is at any rate larger than the limit frequency of the fundamental wave of the phase difference signal by more than two orders of magnitude. Positive or negative edges of the input signal QM are converted to positive or negative spike pulses. The remaining signal parts of the input signal QM are strongly attenuated. The third diagram furthermore shows the positive and negative threshold of the threshold detector 24. Only the spike pulses lie outside the area between these two thresholds. If the lower threshold of the threshold detector 24 is fallen short of, this decision circuit applies a first counting pulse to the up/down-counter 25, so that the count of the counter is incremented by unity. If the upper threshold of the threshold detector 24 is transgressed, the count is accordingly decremented by unity. The time-dependent variation of the count in the present example will become apparent from the fourth diagram of FIG. 10. The count is again sampled with the sampling rate fA and coded with Ng most significant bits.

Figure 11:
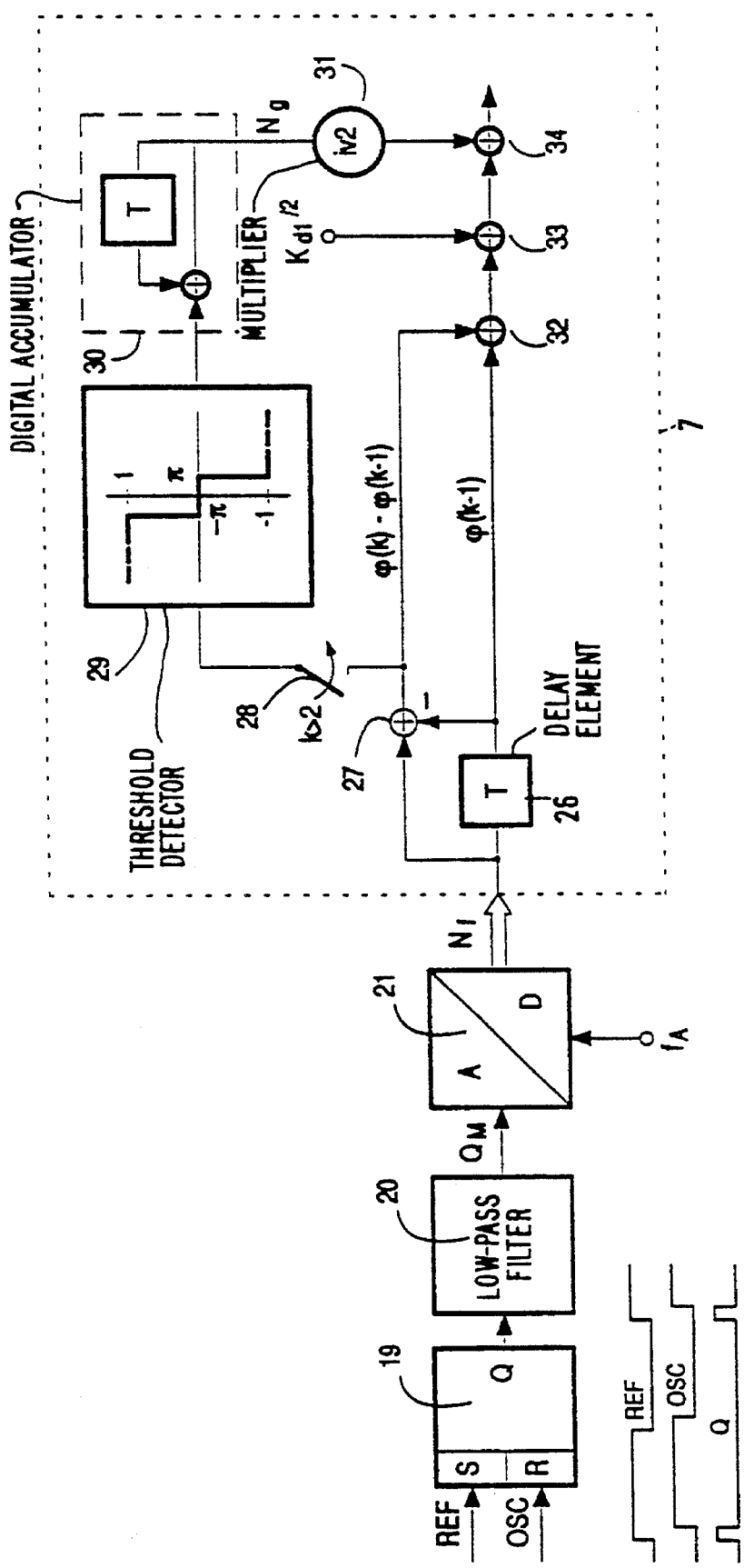

FIG. 11 shows a third embodiment of the phase detector of the second circuit branch. The input of the second circuit branch is coupled to the output of the first circuit branch. The second circuit branch is arranged in the digital section of the phase-locked loop.

A delay element 26 is arranged at the input of the second circuit branch. A subtracter 27 is connected to the input of the second circuit branch and to the output of the delay element 26 and forms the difference between two consecutive sample values of the phase difference. The output of the subtracter 27 is coupled to the input of a threshold detector 29 via a switch 28 which is closed from the third sampled phase difference value onwards. If the difference between two successively sampled phase difference values is smaller than $\pi$, the threshold detector 29 produces the output value of 0. If the difference exceeds or is equal to $\pi$, or is smaller than or equal to $-\pi$ respectively, the threshold detector 29 produces the output value of −1 or 1 respectively. If the sampling rate fA of the phase difference is selected large enough, each steep edge of the output signal of the low-pass filter 20 and thus each $2\pi$-range transgression of the phase difference will be detected. In these cases the value of −1 or 1 is available at the output of the threshold detector 29. The output values of the threshold detector 29 are applied to a digital accumulator 30. This accumulator has the function of an up/down-counter. At the output of the accumulator 30, Ng most significant bits are available. These bits are shifted to the associated most significant locations by the multiplier 31.

A first adder 32 is used for adding together the output values of the delay element 26 and of the subtracter 27. It reconstructs the actual phase difference sample value produced by the first circuit branch. With a second adder 33 this numerical value is added up to the value of Kd½. The number Kd½ corresponds to half the useful range of the sawtooth characteristic i.e. half the width of a sawtooth. This addition causes a centring of the operating point to occur. A third adder 34 adds together the output values of the second adder 33 and of the multiplier 31. It combines the Nf least significant bits of the first circuit branch with the Ng most significant bits of the second circuit branch. The output value represents the phase difference between a reference and an oscillator signal. These numerical values are applied to the digital controller of the phase-locked loop.

I claim:

1. Digital phase-locked loop comprising a controller whose output is coupled to a controllable oscillator, a phase detector whose two inputs are arranged for receiving a reference signal and an oscillator signal that is generated by the oscillator, said phase detector comprising:

a first circuit branch for deriving a first value from the time difference between reference points of the reference and oscillator signals of the phase detector; and a second circuit branch which includes a counter device for detecting a difference between a number of reference points of the reference signal and a number of reference points of the oscillator signal which have been detected from a reference instant (t=0) onwards, to form a second value;

combining means being provided for combining the first and second values to generate a combined value, the combined value being provided to an input of said controller, and the output of said controller controlling the oscillator.

2. Digital phase-locked loop as claimed in claim 1, characterized in that the first circuit branch is provided for:

receiving the reference and oscillator signals, said reference and oscillator signals being pulse shaped;

forming a pulse-shaped signal whose pulse widths are derived from the distance in time between two given successive pulse edges of said reference and oscillator signals used as reference points;

low-pass filtering the pulse-shaped signal; and coding samples values of the low-pass filtered signal with a first number of least significant bits; and in that the second circuit branch is provided for coding the second value with a second number of most significant bits.

3. Digital phase-locked loop as claimed in claim 1, characterized in that the counter means in the second circuit branch comprises an up/down-counter having inputs at which the reference and the oscillator signals are present.

4. Digital phase-locked loop as claimed in claim 1, characterized in that the input of the second circuit branch of the phase detector is arranged for receiving a signal of the first circuit branch, in that a differentiator comprising a high-pass filter is arranged at the second circuit branch for receiving said signal of the first circuit branch, in that a threshold detector is coupled to the output of the differentiator comprising the high-pass filter and in that an up/down-counter is coupled to the output of the threshold detector.

5. Digital phase-locked loop as claimed in claim 1, characterized in that the second circuit branch of the phase detector is coupled to the output of the first circuit branch, in that the second circuit branch is located in a digital section of the digital phase-locked loop, in that the second circuit branch comprises means for producing a difference between two successive phase difference sample values, in that this difference is applied to a threshold detector and in that an accumulator means is provided for integrating the output values of the threshold detector.

6. Digital phase-locked loop as claimed in claim 5 characterized in that the digital section of the phase-locked loop comprises means for processing the phase difference sample values accordance with a non-linear characteristic.

7. Digital phase-locked loop as claimed in claim 1, characterized in that a number of most significant bits generated in the second circuit branch are multiplied by a weight factor.

* * * * *